United States Patent
Lee

(10) Patent No.: US 7,564,300 B2
(45) Date of Patent: Jul. 21, 2009

(54) HIGH VOLTAGE GENERATOR

(75) Inventor: Seok-Joo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/949,661

(22) Filed: Dec. 3, 2007

(65) Prior Publication Data

US 2009/0027110 A1    Jan. 29, 2009

(30) Foreign Application Priority Data

Jul. 25, 2007    (KR) ...................... 10-2007-0074526

(51) Int. Cl.
  *G05F 1/10* (2006.01)
  *G05F 3/02* (2006.01)
(52) U.S. Cl. ...................... 327/540; 327/536; 327/538; 327/541; 363/59
(58) Field of Classification Search ................ 327/148, 327/157, 530, 536–541, 589; 363/59, 60
See application file for complete search history.

(56) References Cited

U.S. PATENT DOCUMENTS 7,279,956 B2 * 10/2007 Caplan et al. ............... 327/536

FOREIGN PATENT DOCUMENTS

KR    1020060007651 A    1/2006

* cited by examiner

*Primary Examiner*—Lincoln Donovan
*Assistant Examiner*—Brandon S Cole
(74) *Attorney, Agent, or Firm*—Townsend and Townsend and Crew LLP

(57) ABSTRACT

A high voltage generator includes a charge pump configured to output a pumping voltage in accordance with a first clock signal and a second clock signal having a level opposed to a level of the first clock signal; a first regulator configured to stabilize the pumping voltage to a voltage having constant level, thereby outputting a first regulation voltage; and a second regulator configured to convert the first regulation voltage into a voltage having constant level, thereby outputting a second regulation voltage. Here, the first regulator increases the pumping voltage by n number so that the first regulation voltage reaches a first level, and the second regulator increases the first regulation voltage by m number so the second regulation voltage reaches a second level smaller than the first level.

20 Claims, 3 Drawing Sheets

US 7,564,300 B2

HIGH VOLTAGE GENERATOR

CROSS-REFERENCE TO RELATED APPLICATIONS

This application claims priority from Korean Patent Application No. 2007-74526, filed on Jul. 25, 2007, the contents of which are incorporated herein by reference in its entirety.

BACKGROUND OF THE INVENTION

The present invention relates to a high voltage generator for supplying a high voltage to a semiconductor memory device, etc.

A common memory device (IC chip, etc.) has circuits requiring a voltage higher than a supply voltage. Here, the high voltage is generally generated by using a charge pump, wherein the charge pump operates in accordance with a clock signal generated by a generating circuit.

A regulator is needed to maintain a constant output voltage of the charge pump.

In a typical regulation method, the output voltage of the charge pump is compared with a reference voltage. In the case that the output voltage is less than the reference voltage, the generating circuit generates the clock signal, and the charge pump is operated in accordance with the clock signal. However, in the case that the output voltage is greater than the reference voltage, the clock signal is not generated.

Accordingly, since the drive of the charge pump is the same even as the output of the charge pump comes close to the reference voltage, a ripple is produced in the output voltage near the reference voltage, and a large amount of current is consumed.

SUMMARY OF THE INVENTION

It is a feature of the present invention to provide a high voltage generator having a charge pump which includes a first regulator and a second regulator, wherein a voltage difference of the regulators is constantly maintained irrespective of the lapse of time.

A high voltage generator according to one example embodiment of the present invention includes a charge pump configured to output a pumping voltage in accordance with a first clock signal and a second clock signal having a level opposed to a level of the first clock signal; a first regulator configured to stabilize the pumping voltage to a voltage having constant level, thereby outputting a first regulation voltage; and a second regulator configured to convert the first regulation voltage into a voltage having constant level, thereby outputting a second regulation voltage. Here, the first regulator increases the pumping voltage by n number so that the first regulation voltage reaches a first level, and the second regulator increases the first regulation voltage by m number so the second regulation voltage reaches a second level smaller than the first level.

A high voltage generator according to another example embodiment of the present invention includes a charge pump configured to output a pumping voltage in accordance with a first clock signal and a second clock signal having a level opposed to a level of the first clock signal; a first regulator configured to stabilize the pumping voltage to a voltage having constant level, thereby outputting a first regulation voltage; a second regulator configured to convert the first regulation voltage into a voltage having constant level, and output the converted voltage; a first control logic configured to control a resistance of a given resistor in a first voltage dividing circuit for controlling an output voltage of the first regulator; and a second control logic configured to control a resistance of a specific resistor in a second voltage dividing circuit for controlling an output voltage of the second regulator.

As described above, in a high voltage generator of the present invention, a voltage difference of a first regulator and a second regulator is constantly maintained irrespective of lapse of time. Accordingly, current passing from a charge pump to the second regulator may be constantly maintained. In addition, a problem that current passing to the charge pump is over increased because a voltage difference of the regulators is great at an operation initial of the charge pump may be solved.

DESCRIPTION OF SPECIFIC EMBODIMENTS

Hereinafter, the embodiments of the present invention will be explained in more detail with reference to the accompanying drawings.

Figure 1A:
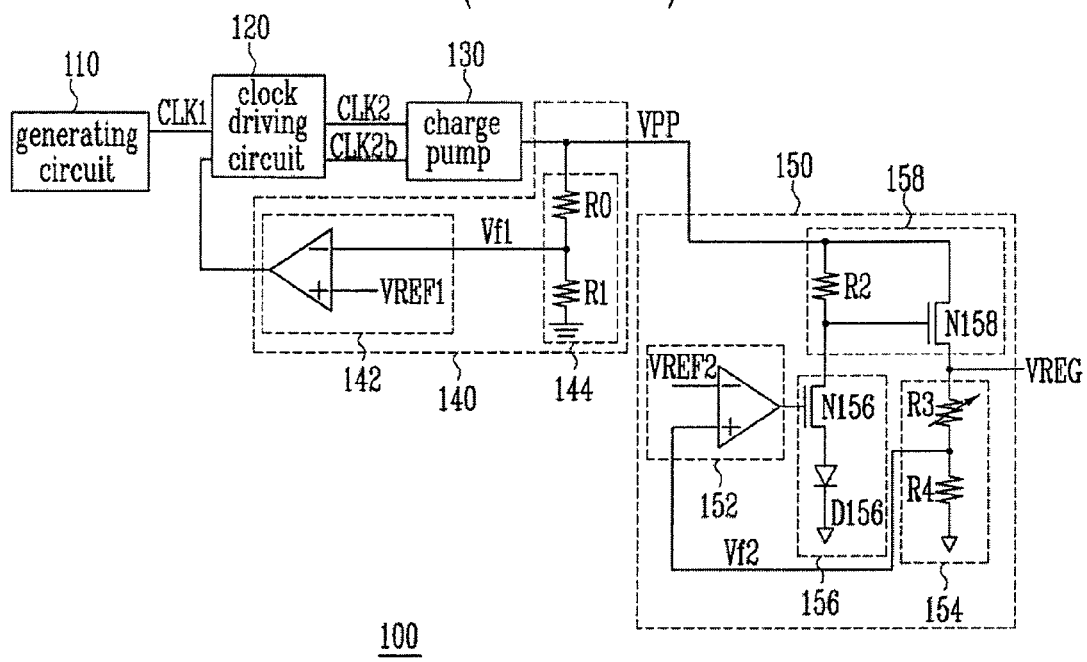
FIG. 1A is a view illustrating a circuitry of a common high voltage generator.

FIG. 1A is a view illustrating a circuitry of a common high voltage generator.

The high voltage generator 100 includes a generating circuit 110, a clock driving circuit 120, a charge pump 130, a first regulator 140 and a second regulator 150.

The generating circuit 110 generates a clock signal CLK1 having a certain period, and transmits the generated clock signal CLK1 to the clock driving circuit 120.

The clock driving circuit 120 delays the clock signal CLK1 in accordance with an output signal of a first comparing circuit 142 included in the first regulator 140, thereby outputting two clock signals CLK2 and CLK2*b*. Here, the clock signal CLK2 is an inverted signal of clock signal CLK2*b*. The clock driving circuit 120 includes a first inverter group having n inverters coupled in series and a second inverter group having (n+1) inverters coupled in series, wherein the inverter groups are not shown.

The charge pump 130 performs a pumping operation in accordance with the clock signal CLK2 and CLK2*b* outputted from the clock driving circuit 120, thereby outputting a certain pumping voltage VPP.

The first regulator 140 stabilizes the pumping voltage to a given voltage having a constant level, and then outputs a first regulation voltage.

The first regulator 140 includes a first dividing circuit 144 for dividing the pumping voltage and outputting a first dividing voltage Vf1, and the first comparing circuit 142 for comparing the first dividing voltage Vf1 with a first reference voltage VREF1 and controlling an operation of the clock driving circuit 120 in accordance with the comparing result.

The first voltage dividing circuit 144 includes a plurality of resistors R0 and R1 coupled in series between an output terminal of the charge pump 130 and a ground, and outputs the first dividing voltage Vf1 inputted to the first comparing circuit 142 in accordance with a resistance of the resistors R0 and R1.

The first comparing circuit 142 compares the first reference voltage VREF1 with the first dividing voltage Vf1, and outputs a signal having a high level to the clock driving circuit 120 in the case that the first reference voltage VREF1 is greater than the first dividing voltage Vf1. To perform the above function, the first comparing circuit 142 includes an OP amplifier, wherein the first reference voltage VREF1 is inputted to a non-inverting terminal (+) of the OP amplifier and the first dividing voltage Vf1 is inputted to an inverting terminal (−) of the OP amplifier.

A final pumping voltage VPP is expressed below as Equation 1, and is a first regulation voltage.

$$VPP = \left(1 + \frac{R0}{R1}\right) \times VREF1 \quad \text{[Equation 1]}$$

Since the first regulator 140 outputs the first regulation voltage by controlling only an operation of the charge pump 130, a ripple occurs to an output of the first regulator. To remove the ripple, the high voltage generator includes the second regulator 150 using a current control method.

The second regulator 150 converts the first regulation voltage into a voltage having a constant level, and outputs a second regulation voltage in accordance with the converting.

The second regulator 150 includes a second comparing circuit 152, a second voltage dividing circuit 154, a current isolating circuit 156 and a voltage supplying circuit 158.

The second voltage dividing circuit 154 has a plurality of resistors R3 and R4 coupled in series between an output terminal VREG and the ground, divides the second regulation voltage in accordance with the resistance of the resistors R3 and R4, and outputs a second dividing voltage Vf2 to the second comparing circuit 152. Here, the voltage VREG of the output terminal is adjusted by controlling a resistance of the third resistor R3.

The second comparing circuit 152 compares the second diving voltage Vf2 with a second reference voltage VREF2, and controls an operation of the current isolating circuit 156 in accordance with the comparing results.

In addition, the second comparing circuit 152 includes an OP amplifier, wherein the second reference voltage VREF2 is inputted to an inverting terminal (−) of the OP amplifier, and the second diving voltage Vf2 is inputted to a non-inverting terminal (+) of the OP amplifier. In this case, a voltage identical to the second diving voltage Vf2 is provided as the second reference voltage VREF2, and a second diving voltage inputted in reality is compared with the second reference voltage VREF2.

Hence, the second comparing circuit 152 outputs a voltage having a high level in the case that the second dividing voltage is higher than the second reference voltage VREF2, and outputs a voltage having a low level in the case that the second dividing voltage is smaller than the second reference voltage VREF2.

The current isolating circuit 156 includes an N-MOS transistor N156, turned on in response to an output voltage of the second comparing circuit 152, and forms a current path between an output terminal of the first regulator 140 and the ground.

The N-MOS transistor N156 is coupled between the voltage supplying circuit 158 and the ground, and is turned on in response to a signal having a high level, thereby forming a current path between the output terminal of the charge pump 130 and the ground.

The current isolating circuit 156 may further include a diode D156 between the N-MOS transistor N156 and the ground, wherein the diode D156 allows the current to flow only in one direction.

Since the comparing circuit 152 outputs a voltage having a high level in the case that the second dividing voltage is higher than the second reference voltage VREF2, the current path is formed through the current isolating circuit 156.

Here, a current passing through the current path is increased more as the second dividing voltage is higher than the second reference voltage VREF2. In addition, a level of the first regulation voltage VPP is lowered when the current path is formed through the current isolating circuit 156.

In the case that the second dividing voltage is smaller than the second reference voltage VREF2, the comparing circuit 152 outputs a voltage having a low level. Hence, the N-MOS transistor N156 is turned off, and so the current path is cut off.

The voltage supplying circuit 158 supplies to the output terminal VREG of the second regulator 150 or cuts off the first regulation voltage VPP in accordance with the current path.

The voltage supplying circuit 158 includes a resistor R2 coupled between the output terminal of the charge pump 130 and the current isolating circuit 156, and an N-MOS transistor N158 coupled between the output terminal of the charge pump 130 and the output terminal VREG of the second register 150, wherein a gate of the N-MOS transistor N158 is coupled to a couple portion of the resistor R2 and the current isolating circuit 156.

In the case that the current path is not formed, the first regulation voltage VPP is directly applied to the gate of the N-MOS transistor N158. As a result, the N-MOS transistor N158 is turned on, and so the first regulation voltage VPP is applied to the output terminal VREG of the second regulator 150.

However, in the case that the current path is formed, the N-MOS transistor N158 is turned off because a voltage having a low level is applied to the gate of the N-MOS transistor N158. As a result, the first regulation voltage VPP is not supplied to the output terminal VREG of the second regulator 150.

The voltage of the output terminal VREG of the second regulator 150 is expressed below as Equation 2.

$$VREG = \left(1 + \frac{R3}{R4}\right) \times VREF2 \quad \text{[Equation 2]}$$

In the case that the high voltage generator 100 employs the second regulator 150 using a current control method, an operation current passing to the charge pump 130 may be increased more compared to that in the high voltage generator employing only the first regulator 140. Additionally, a current may be increased as a difference of the output voltage VPP of the first regulator 140 and the output voltage VREG of the second regulator 150 is increased.

Figure 1B:
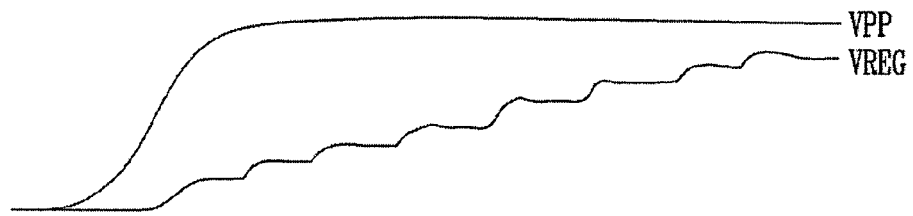
FIG. 1B is a view illustrating an output voltage of the high voltage generator.

FIG. 1B is a view illustrating an output voltage of the high voltage generator.

Generally, the second regulation voltage is gradually increased under the condition that the first regulation voltage VPP is increased to a specific voltage level. Since a difference of the pumping voltage VPP and the voltage VREG of the output terminal of the second regulator 150 is large in an initial operation, the current passing to the charge pump 130 is increased.

Figure 2:
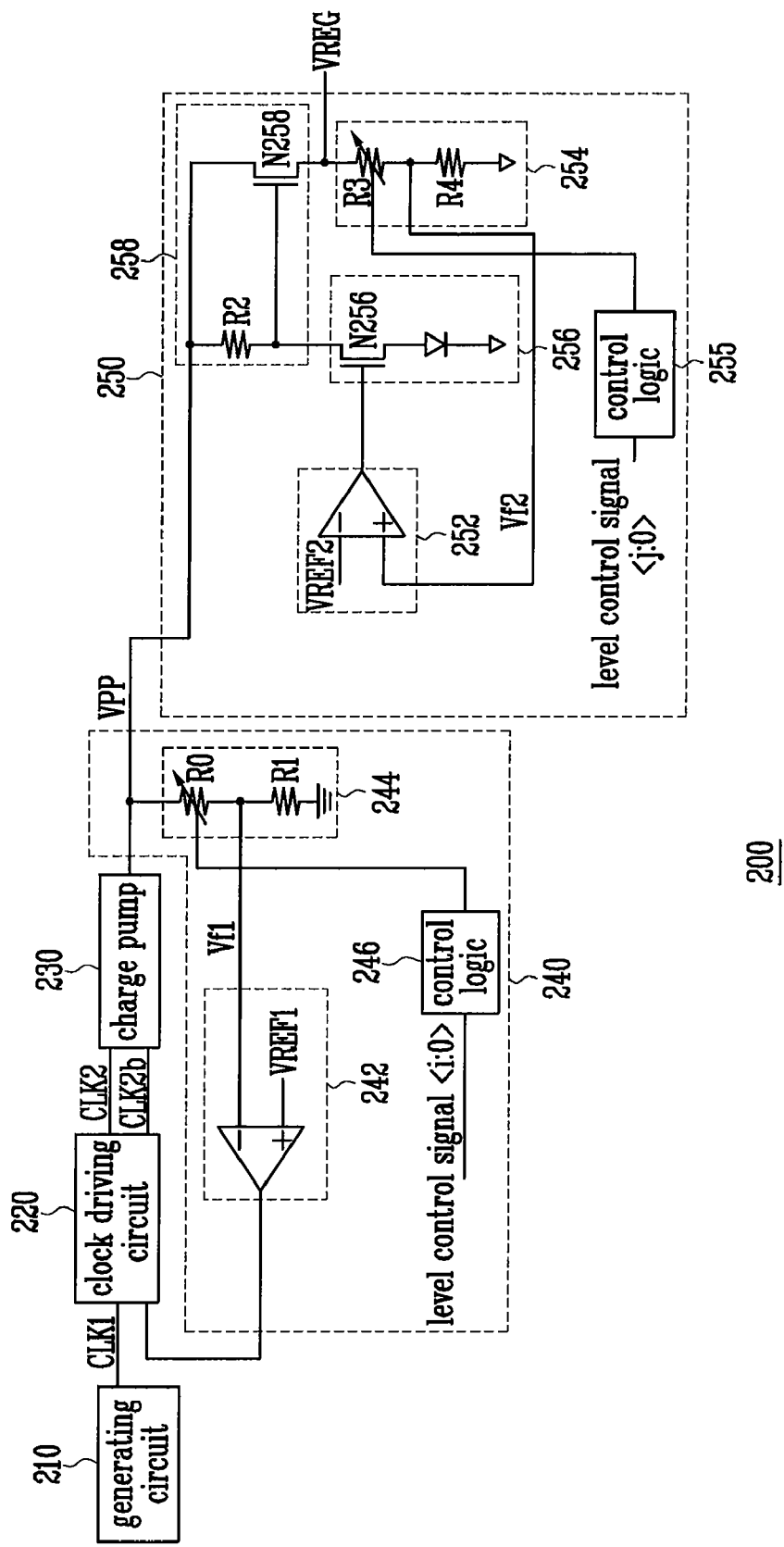
FIG. 2 is a view illustrating a circuit of a high voltage generator according to one example embodiment of the present invention.

FIG. 2 is a view illustrating a circuitry of a high voltage generator according to one example embodiment of the present invention.

The high voltage generator 200 of the present embodiment includes a generating circuit 210, a clock driving circuit 220, a charge pump 230, a first regulator 240 and a second regulator 250.

The generating circuit 210 generates a clock signal CLK1 having a specific period, and transmits the generated clock signal CLK1 to the clock driving circuit 220.

The clock driving circuit 220 delays the clock signal CLK1 in accordance with an output signal of a first comparing circuit 242 included in the first regulator 240, and outputs clock signals CLK2 ("first clock signal") and CLK2b ("second clock signal"), wherein the second clock signal CLK2b has a level opposed to a level of the first clock signal CLK2, i.e., the first and second clock signals are inverse of each other.

The charge pump 230 performs a pumping operation in accordance with the clock signals CLK2 and CLK2b outputted from the clock driving circuit 220, thereby outputting a pumping voltage VPR The first regulator 240 stabilizes the pumping voltage to a voltage having a constant level, and then outputs a first regulation voltage. Here, the first regulator 240 increases the pumping voltage by n number so that the regulation voltage reaches a first level. No. "n" is the number of step to reach the target voltage Vpp from 0V in FIG. 3, 4, 5. In FIG. 1B. just one step is needed to reach the target voltage Vpp.

The first regulator 240 has a first voltage dividing circuit 244 for dividing the pumping voltage and outputting a first dividing voltage Vf1, the first comparing circuit 242 for comparing the first dividing voltage Vf1 with a first reference voltage VREF1 and controlling an operation of the clock driving circuit 220 in accordance with the comparing results, and a first control logic 246 for controlling a magnitude of the first dividing voltage Vf1.

The first voltage dividing circuit 244 has a plurality of resistors R0 and R1 coupled in series between an output terminal of the charge pump 230 and a ground, and outputs the first dividing voltage Vf1 inputted to the first comparing circuit 242 in accordance with a resistance of the resistors R0 and R1. Here, the first control logic 246 controls a resistance of the first resistor R0, thereby adjusting a voltage VPP of the output terminal of the charge pump 230.

The first comparing circuit 242 compares the first reference voltage VREF1 with the first dividing voltage Vf1, and outputs a signal having a high level to the clock driving circuit 220 when the first reference voltage VREF1 is higher than the first dividing voltage Vf1. In one embodiment, the first comparing circuit 242 has an OP amplifier, wherein the first reference voltage VREF1 is inputted to a non-inverting terminal (+) of the OP amplifier, and the first dividing voltage Vf1 is inputted to an inverting terminal (−) of the OP amplifier.

In another embodiment of the present invention, the first comparing circuit 242 may include a differential amplifier, wherein the first reference voltage VREF1 is inputted to a non-inverting terminal (+) of the differential amplifier, and the first dividing voltage Vf1 is inputted to an inverting terminal (−) of the differential amplifier. Here, a voltage identical to the first dividing voltage Vf1 is applied as the first reference voltage VREF1, and thus a first dividing voltage inputted in reality may be compared with the first reference voltage VREF1.

The voltage (final pumping voltage) VPP of the output terminal of the charge pump 230 is expressed below as Equation 3, and corresponds to the first regulation voltage.

$$VPP = \left(1 + \frac{R0}{R1}\right) \times VREF1 \quad \text{[Equation 3]}$$

The first control logic 246 adjusts the resistance of the first resistor R0.

The first control logic 246 receives a level control signal CTLBUS<i:0> having digital data through a data bus, and decodes the received level control signal CTLBUS<i:0>, thereby generating $2^i$ possible signals. Then, the first control logic 246 outputs one of the signals, and so a specific resistance of a given $2^i$ resistances corresponding to $2^i$ signals is selected as the resistance of the resistor R0.

As a result, $2^i$ different regulation voltages may be outputted. The first regulator 240 increases the pumping voltage by n number through the above control so that the regulation voltage reaches the first level.

The second regulator 250 converts the first regulation voltage into a voltage having a constant level, thereby outputting the second regulation voltage. Particularly, the second regulator 250 increases the first regulation voltage by m (m≧n) number so that the second regulation voltage reaches a second level smaller than the first level of the first regulation voltage.

The second regulator 250 includes a second comparing circuit 252, a second voltage dividing circuit 254, a current isolating circuit 256 and a voltage supplying circuit 258.

The second voltage dividing circuit 254 has a plurality of resistors R3 and R4 coupled between the output terminal VREG and the ground, and divides the second regulation voltage in accordance with a resistance of the resistors R3 and R4, thereby outputting a second dividing voltage Vf2 inputted to the second comparing circuit 252. Here, the voltage VREG of the outputting terminal is controlled by adjusting a resistance of the third resistor R3.

The second comparing circuit 252 compares the second dividing voltage with a second reference voltage VREF2, and controls an operation of the current isolating circuit 256 in accordance with the comparing result. In one example embodiment of the present invention, the second comparing circuit 252 has an OP amplifier, wherein the second reference voltage VREF2 is inputted to an inverting terminal (−) of the OP amplifier, and the second dividing voltage is inputted to a non-inverting terminal (+) of the OP amplifier.

In another embodiment of the present invention, the second comparing circuit 252 may include a differential amplifier, wherein the second reference voltage VREF2 is inputted to a non-inverting terminal (+) of the differential amplifier, and the second dividing voltage is inputted to an inverting terminal (−) of the differential amplifier.

The second comparing circuit 252 outputs a voltage having a high level when the second dividing voltage is higher than the second reference voltage VREF2. However, the second comparing circuit 252 outputs a voltage having a low level when the second dividing voltage is smaller than the second reference voltage VREF2.

The current isolating circuit 256 forms a current path between the output terminal of the first regulator 240 and the ground using an N-MOS transistor N256 turned on in response to an output voltage of the second comparing circuit 252. The N-MOS transistor N256 is coupled between the voltage supplying voltage 258 and the ground, and is turned on in response to the signal having a high level, thereby forming the current path between the output terminal of the charge pump 230 and the ground. In one example embodiment of the present invention, the current isolating circuit 256 may further include a diode D256 for allowing current to only flow in one direction.

Accordingly, since the comparing circuit 252 output the signal having a high level when the second dividing voltage is higher than the second reference voltage VREF2, the current path is formed through the current isolating circuit 256. However, since the comparing circuit 252 outputs the signal having a low level when the second dividing voltage is smaller than the second reference voltage VREF2, the current path is cut off by the current isolating circuit 256.

The voltage supplying circuit 258 supplies the first regulation voltage VPP to the output terminal VREG of the second regulator 250 or cuts off the first regulation voltage VPP in accordance with the forming of the current path.

The voltage supplying voltage 258 includes a resistor R2 coupled between the output terminal of the charge pump 230 and the current isolating circuit 256, and an N-MOS transistor N258 coupled between the output terminal of the charge pump 230 and the output terminal of the second regulator 250, wherein a voltage of a couple point of the resistor R2 and the current isolating circuit 256 is applied to a gate of the N-MOS transistor N258.

In the case that the current path is not formed, the first regulation voltage is directly applied to the gate of the N-MOS transistor N258 so that the N-MOS transistor N258 is turned on. As a result, the first regulation voltage is provided to the output terminal of the second regulator 250.

In the case that the current path is formed, the N-MOS transistor N258 is not turned on, and so the first regulation voltage is not provided to the output terminal of the second regulator 250.

The voltage VREG of the output terminal of the second regulator 250 is expressed below as Equation 4.

$$VREG = \left(1 + \frac{R3}{R4}\right) \times VREF2 \quad \text{[Equation 4]}$$

The second control logic 255 adjusts the resistance of the third resistor R3

The second control logic 255 receives a level control signal CTLBUS<j:0> having digital data through a data bus, and decodes the received level control signal CTLBUS<j:0>, thereby generating $2^j$ possible signals. Then, the second control logic 255 outputs one of the signals, and so a specific resistance of a given $2^j$ resistances corresponding to $2^j$ signals is selected as the resistance of the resistor R3.

As a result, $2^j$ different regulation voltages may be outputted. The second regulator 250 increases the voltage by m number through the above control so that the regulation voltage reaches the second level.

Figure 3:
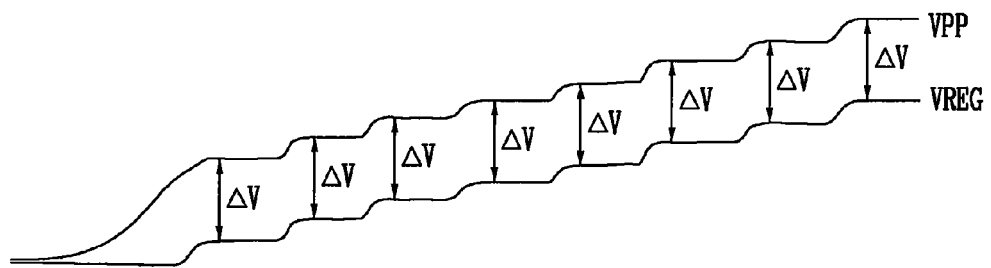
FIG. 3 is a view illustrating an output voltage of the high voltage generator according to one example embodiment of the present invention.

FIG. 3 is a view illustrating an output voltage of the high voltage generator according to one example embodiment of the present invention.

Here, it is assumed that the level control signal CTLBUS<i:0> inputted to the first control logic 246 is identical to the level control signal CTLBUS<j:0> inputted to the second control logic 255.

That is, the level control signal CTLBUS<i:0> having i bits is transmitted to the first control logic 246, and so $2^i$ first resistances with different values are selected. In addition, the level control signal CTLBUS<i:0> having i bits is transmitted to the second control logic 255, and so $2^i$ third resistances with different values are selected.

For example, $2^3$, i.e. 8 different voltages are outputted lo by transmitting the level control signal CTLBUS<2:0>.

In the case that the resistor R0 included in the first voltage dividing circuit 244 of the first regulator 240 and the resistor R3 included in the second voltage dividing circuit 254 of the second regulator 250 are increased in sequence with similar change, the first regulation voltage and the second regulation voltage are increased with a constant level difference as shown in FIG. 3.

Accordingly, unlike in the common high voltage regulator where the voltage difference of the first regulation voltage and the second regulation voltage is irregularly changed as shown in FIG. 1B, the current passing to the charge pump 230 in the high voltage generator 200 of the present embodiment may be constantly maintained because the voltage difference of the first regulation voltage and the second regulation voltage is constant.

Figure 4:
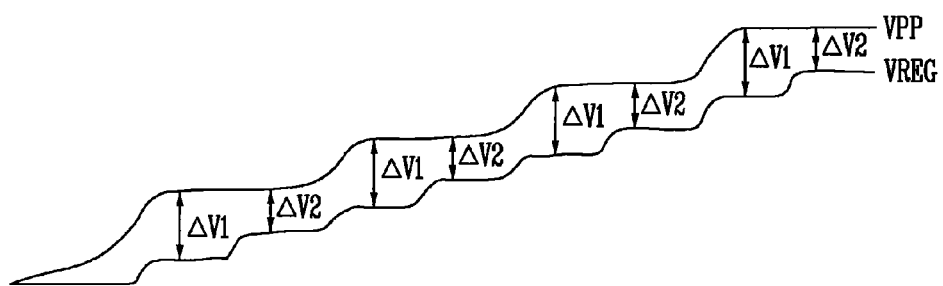
FIG. 4 is a view illustrating an output voltage of the high voltage generator according to another example embodiment of the present invention.

FIG. 4 is a view illustrating an output voltage of the high voltage generator according to another example embodiment of the present invention.

Here, it is assumed that the level control signal CTLBUS<i:0> inputted to the first control logic 246 is different from the level control signal CTLBUS<j:0> inputted to the second control logic 255.

That is, the level control signal CTLBUS<i:0> having i bits is transmitted to the first control logic 246, and so $2^i$ first resistances with different values are selected. In addition, the level control signal CTLBUS<i+1:0> having (i+1) bits is transmitted to the second control logic 255, and so $2^{i+1}$ third resistances with different values are selected.

For example, the level control signal CTLBUS<1:0> is transmitted to the first control logic 246, and so $2^2$, i.e. 4 different voltages are outputted. The level control signal CTLBUS<2:0> is transmitted to the second control logic 255, and so $2^3$, i.e. 8 different voltages are outputted.

Accordingly, in case that the resistor R0 included in the first voltage dividing circuit 244 of the first regulator 240 and the resistor R3 included in the second voltage dividing circuit 254 of the second regulator 250 are increased in sequence with similar change, the first regulation voltage and the second regulation voltage are increased with similar level difference as shown in FIG. 4. In other words, the voltage difference of the first regulation voltage and the second regulation voltage is not constantly maintained unlike that in FIG. 3, but is uniform compared to that in FIG. 1B.

Figure 5:
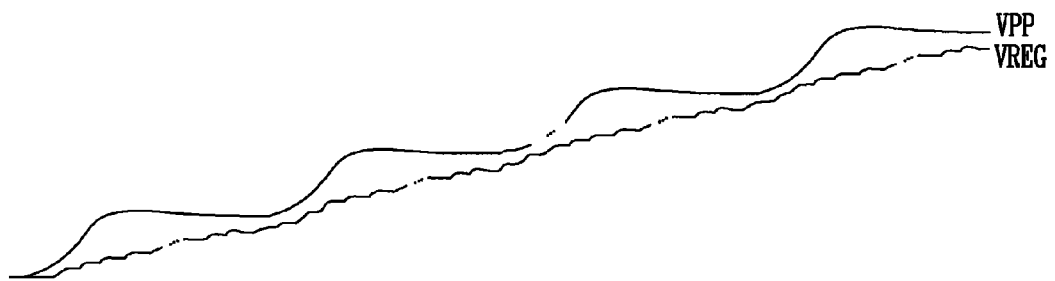
FIG. 5 is a view illustrating an output voltage of a high voltage generator according to still another example embodiment of the present invention.

FIG. 5 is a view illustrating an output voltage of a high voltage generator according to still another example embodiment of the present invention.

Here, it is assumed that the level control signal CTLBUS<i:0> inputted to the first control logic 246 is different from the level control signal CTLBUS<j:0> inputted to the second control logic 255. Additionally, an increase number of the first regulation voltage is different from that of the second regulation voltage.

That is, the level control signal CTLBUS<i:0> having i bits is transmitted to the first control logic 246, and so $2^i$ first resistances with different values are selected. In addition, the level control signal CTLBUS<j:0> having j bits is transmitted to the second control logic 255, and so $2^j$ third resistances with different values are selected.

A voltage difference of the first regulation voltage and the second regulation voltage is not constantly maintained compared to that in FIG. 3 and FIG. 4, but is constantly maintained compared to that in FIG. 1B.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A high voltage generator comprising:
    a charge pump configured to output a pumping voltage in accordance with a first clock signal and a second clock signal, the first and second clock signal being in an inverse state of each other;
    a first regulator configured to output a first regulation voltage by regulating the pumping voltage; and
    a second regulator configured to output a second regulation voltage by regulating the first regulation voltage,
    wherein the first regulator increases the first regulation voltage by n number so that the first regulation voltage reaches a first level, and the second regulator increases the second regulation voltage by m number so the second regulation voltage reaches a second level that is smaller than the first level.

2. The high voltage generator of claim 1, wherein m is equal to or greater than n.

3. The high voltage regulator of claim 1, wherein the first regulator includes:
    a first voltage dividing circuit configured to divide the pumping voltage and output a first dividing voltage according to the dividing of the pumping voltage;
    a first comparing circuit configured to control an operation of a clock driving circuit based on a comparison of the first dividing voltage with a first reference voltage; and
    a first control logic configured to control a magnitude of the pumping voltage outputted by the first regulator by adjusting the first dividing voltage.

4. The high voltage generator of claim 3, wherein the first voltage dividing circuit includes a first resistor and a second resistor coupled in series between an output terminal of the first regulator and a ground, and wherein a resistive value of the first resistor is varied by the first control logic.

5. The high voltage generator of claim 4, wherein the second regulator includes:
    a current isolating circuit configured to form a current path between the output terminal of the first regulator and the ground;
    a second voltage dividing circuit configured to divide a voltage of an output terminal of the second regulator, and output a second dividing voltage in accordance with the dividing of the voltage of the output terminal;
    a second comparing circuit configured to compare the second dividing voltage with a second reference voltage, and control an operation of the current isolating circuit through the comparison of the second voltage with the second reference voltage;
    a voltage supplying circuit configured to provide the first regulation voltage to an output terminal of the second regulator or cut off the first regulation voltage in accordance with the forming of the current path; and
    a second control logic configured to control a magnitude of an output voltage of the second regulator by adjusting the second dividing voltage.

6. The high voltage generator of claim 5, wherein the second voltage dividing circuit includes a third resistor and a fourth resistor coupled in series between the output terminal of the second regulator and the ground, and
    wherein a resistance of the third resistor is varied by the second control logic.

7. The high voltage generator of claim 6, wherein the first control logic selects one of $2^i$ resistances having different values in response to a first level control signal having i bits, and the second control logic selects one of $2^j$ resistances having different values in response to a second level control signal having j bits.

8. The high voltage generator of claim 7, wherein the level control signals increase in sequence the first resistor and the third resistor so that a voltage difference of the first regulation voltage and the second regulation voltage is substantially constant.

9. The high voltage generator of claim 7, wherein the j is identical to the i.

10. The high voltage generator of claim 7, wherein the j equals to (i+1).

11. The high voltage generator of claim 1, wherein a voltage increase in the first regulator and a voltage increase in the second regulator are substantially constant, respectively.

12. A high voltage generator comprising:
    a charge pump configured to output a pumping voltage in accordance with a first clock signal and a second clock signal, the first and second clock signals being inverse of each other;
    a first regulator configured to output a first regulation voltage by regulating the pumping voltage;
    a second regulator configured to output a second regulation voltage by regulating the first regulation voltage;
    wherein the first regulator increases the first regulation voltage by n number so that the first regulation voltage reaches a first level, and the second regulator increases the second regulation voltage by m number so the second regulation voltage reaches a second level that is smaller than the first level;
    a first control logic configured to control a resistance of a given resistor in a first voltage dividing circuit for controlling the first regulation voltage of the first regulator; and
    a second control logic configured to control a resistance of a specific resistor in a second voltage dividing circuit for controlling the second regulation voltage of the second regulator.

13. The high voltage regulator of claim 12, wherein the first regulator includes:
    a first voltage dividing circuit configured to output a first dividing voltage by dividing the pumping voltage; and a first comparing circuit configured to control an operation of a clock driving circuit by comparing the first dividing voltage with a first reference voltage.

14. The high voltage generator of claim 12, wherein the first voltage dividing circuit includes a first resistor and a second resistor coupled in series between an output terminal of the first regulator and a ground, and wherein a resistance of the first resistor is varied by the first control logic.

15. The high voltage generator of claim 12, wherein the second regulator includes:
- a current isolating circuit configured to form a current path between the output terminal of the first regulator and the ground;
- a second voltage dividing circuit configured to output a second dividing voltage by dividing a voltage of an output terminal of the second regulator;
- a second comparing circuit configured control an operation of the current isolating circuit by comparing the second dividing voltage with a second reference voltage; and
- a voltage supplying circuit configured to provide the first regulation voltage to an output terminal of the second regulator or cut off the first regulation voltage in accordance with the forming of the current path.

16. The high voltage generator of claim 15, wherein the second voltage dividing circuit includes a third resistor and a fourth resistor coupled in series between the output terminal of the second regulator and the ground, and
wherein a resistance of the third resistor is varied by the second control logic.

17. The high voltage generator of claim 12, wherein the first control logic selects one of $2^i$ resistances having different values in response to a first level control signal having i bits, and the second control logic selects one of $2^j$ resistances having different values in response to a second level control signal having j bits.

18. The high voltage generator of claim 17, wherein the level control signals increase in sequence the first resistor and the third resistor so that a voltage difference of the first regulation voltage and the second regulation voltage is substantially constant.

19. The high voltage generator of claim 18, wherein the j equals to (i+1).

20. The high voltage generator of claim 17, wherein the j is identical to the i.

* * * * *